United States Patent [19]

Jensen

[11] Patent Number: 4,972,148

[45] Date of Patent: Nov. 20, 1990

[54] MAGNETIC RESONANCE TOMOGRAPHY METHOD AND MAGNETIC RESONANCE TOMOGRAPHY APPARATUS FOR PERFORMING THE METHOD

[75] Inventor: Jens D. Jensen, Hamburg, Fed. Rep. of Germany

[73] Assignee: U.S. Philips Corporation, New York, N.Y.

[21] Appl. No.: 378,960

[22] Filed: Jul. 12, 1989

[30] Foreign Application Priority Data

Jul. 15, 1988 [DE] Fed. Rep. of Germany ....... 3823961

[51] Int. Cl.⁵ .............................................. G01R 33/20
[52] U.S. Cl. ..................................... 324/309; 324/307
[58] Field of Search ............... 324/300, 307, 309, 310, 324/311, 312, 313, 314, 318, 322; 128/653

[56] References Cited

U.S. PATENT DOCUMENTS

| | | | |
|---|---|---|---|
| 4,734,646 | 3/1988 | Shenoy et al. ...................... | 324/309 |
| 4,739,766 | 4/1988 | Riederer ............................... | 324/309 |
| 4,748,409 | 5/1989 | Frahn et al. ......................... | 324/309 |
| 4,769,603 | 9/1988 | Oppelt et al. ....................... | 324/309 |
| 4,796,635 | 1/1989 | Damoalin ...................... | 128/653 AF |

*Primary Examiner*—Michael J. Tokar
*Attorney, Agent, or Firm*—Jack D. Slobod

[57] ABSTRACT

The invention relates to a magnetic resonance tomography method where two slice-selective rf pulses influence the nuclear magnetization in a slice. Further slice selective rf pulses which excite sub-slices extending perpendicularly to said slice generate stimulated echo signals in the strip-shaped zone of intersection between the relevant sub-slice and the slice. The FID signals associated with the further rf pulses are suppressed by means of a subsequently activated magnetic gradient field. In order to ensure that this field does not dephase the desired stimulated echo signals at the same time magnetic gradient field having the same time integral is activated between the first and the second rf pulse.

17 Claims, 3 Drawing Sheets

MAGNETIC RESONANCE TOMOGRAPHY METHOD AND MAGNETIC RESONANCE TOMOGRAPHY APPARATUS FOR PERFORMING THE METHOD

BACKGROUND OF THE INVENTION

The invention relates to s magnetic resonance tomography method where a first slice-selective rf pulse and a second rf pulse act on an examination zone in the presence of a uniform, steady magnetic field, after which further slice-selective pulses are applied to the examination zone, which further pulses excite the nuclear magnetisation in mutually parallel sub-slices which extend perpendicularly with respect to the slice, and where the stimulated echo signals which occur in the associated sub-slice subsequent to each further rf pulse are received and subjected to a Fourier transformation, and also relates to a magnetic resonance tomography apparatus for performing the method.

A method of this kind is known from EP-PS No. 184 810 which corresponds to U.S. Pat. No. 4,748,409. The nuclear magnetisation distribution in an examination zone can thus be measured by means of a single "shot", i.e using only one sequence; therefore, in comparison with the conventional magnetic resonance tomography methods which involve a plurality of sequences the measuring time is short. On the other hand the measuring time is longer than in the method which is known from the magazine "Magnetic resonance in medicine" 5, pages 563 to 571, 1987 where the data must be acquired within a period of no longer than approximately 40 ms. This method necessitates the use of magnetic gradient fields having an extremely large gradient which must be switched within an extremely short period of time when a given spatial resolution is to be obtained. The associated variations in time of the magnetic flux density are a multiple of the guidelines issued by various countries, such as the guidelines product by the FOA (USA). Because the measuring time is substantially longer in the method described in the preamble, the requirements imposed as regards the strength of the gradient field and the rate of change of field strength are substantially less severe In the known method described above each of the further rf pulses generates not only the desired stimulated echo signal but also a so-called FID signal which relates to the free induction decay, that is to say throughout the entire sub-slice excited by this rf pulse. This undesirable FID signal is slightly dephased by the magnetic gradient field which is generated after each further rf pulse until the beginning of the reception of the stimulated echo signal, referred to hereinafter as the STE signal. Therefore, it is received and subjected to Fourier transform together with the STE signal, so that errors occur in the nuclear magnetisation distribution determined or artefacts appear in the image of this distribution.

SUMMARY OF THE INVENTION

It is an object of the present invention to provide a method of the kind set forth so that the FID signal associated with each further rf pulse is suppressed. This object is achieved in accordance with the invention in that subsequent to each further rf pulse and before the reception of the associated spin resonance signal a magnetic gradient field is switched on and off in order to dephase the FID signal associated with the rf pulse, in that between the first and the second rf pulse a magnetic gradient field is switched on and off, and in that the gradients of these fields extend parallel or anti-parallel with respect to one another, the absolute value of their time integral being the same. The FID signal is thus suppressed in that subsequent to each further rf pulse and before the recePtion of the associated STE signal a magnetic gradient field is switched on and off in order to dephase the FID signal associated with this rf pulse. For compete dephasing of this signal the time integral over the magnetic gradient field before the reception of the STE signal must be sufficiently large. The magnetic gradient field applied subsequent to each further rf pulse, however, also influences the STE signal. In order to ensure that the latter signal is not dephased, a magnetic gradient field having gradients which extend in the same direction (or antiparallel thereto) is switched on and off between the first and the second rf pulse. This magnetic gradient field pre-dephases the STE signal, which pre-dephasing is compensated for by the (re) dephasing introduced by the switching on and off of the magnetic gradient field subsequent to each further rf pulse, if the absolute values of the time integrals over the two magnetic gradient fields are the same. Consequently, with the exception of the STE signal all components of the spin resonance signals associated with the rf pulses are suppressed.

In the known method the second rf pulse is a non-selective rf pulse, i.e it excites not only the nuclear magnetisation in the previously excited slice but also that in the entire examination zone. The excitation of the nuclear magnetisation outside the already excited slice may give rise to the occurrence of FID signals or spin echo signals in conjunction with the further rf pulses. Even though these signals can be dephased by a magnetic gradient field which is switched on and off after the second rf pulse, dephasing must be complete in order to ensure that the residual signal components from the overall substantially larger regions outside the slice do not have a magnitude which is comparable to that of the STE signal inside the slice. In a further version of the invention this can be avoided in that the second rf pulse is a slice-selective rf pulse and influences the same slice as the first rf pulse. In this version, therefore, the second rf pulse does not influence the nuclear magnetisation outside the slice.

The STE signal is usually received in association with a magnetic gradient field, the so-called read gradient. In order to improve the signal-to-noise ratio the polarity of the gradient is reversed after the reception of the stimulated echo signal, the rephased echo signals then occurring being received and evaluated. The rephased echo signals can then be added to the STE signal before or after Fourier transform, the statistic signal fluctuations imposed by noise thus being reduced.

The method in accordance with the invention should bs carried out within a period of time which is shorter than the longitudinal relaxation time of the protons excited by the rf pulses. The frequency of the rf pulses is customarily chosen so that the hydrogen protons are excited. It is known that nuclei of water-bound hydrogen atoms have a $T_1$ relaxation time which is longer than that of nuclei of hydrogen atoms bound to lipids (fat). Therefore, the method in accordance with the invention can produce concurrent images of tissue containing fat and tissue containing water in the sub-slices first excited, whilst of the sub-slices last excited only the water tissue is reproduced. This can be avoided in a further version of the invention in that the first rf pulse is preceded by a frequency selective rf pulse which excites fat-bound protons, after which a magnetic gradient field is switched on and off. The central frequency of the frequency selective rf pulse is then adjusted to the resonant frequency of the fat-bound protons. It is thus achieved that the fat bound protons are dephased so that they cannot make a signal contribution.

In a further version of the invention, the ratio of the magnetic gradient field applied in conjunction with each further rf pulse to the bandwidth of the relevant rf pulse is varied so that upon excitation of the sub-slices strips of different width are excited. The particularly narrow strips can thus be situated in the diagnostically relevant region, so that at that area a spatial resolution is obtained which is higher than that obtained in other parts of the excited slice.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 1:
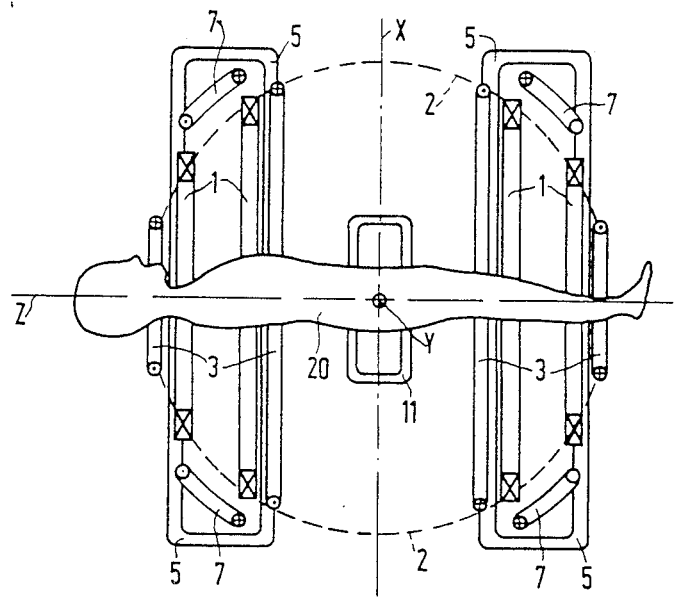
FIG. 1 shows a magnetic resonance tomography apparatus which is suitable for carrying out the method in accordance with the invention.

The magnetic resonance tomography apparatus shown in FIG. 1 comprises a system for generating a uniform, steady magnetic field, which system consists of four coils 1 and which magnetic field may have a strength of from some tenths of T to some T. This field extends in the z direction of a cartesian coordinate system. The coils are concentrically arranged with respect to the z axis and may situated on a spherical surface 2. The patient 20 to be examined is arranged within these coils.

In order to generate a magnetic field Gz which extends in the z direction and which linearly varies in this direction there are provided four coils 3 which are preferably arranged on the same spherical surface. There are also provided four coils 7 which generate a magnetic gradient field Gx which also extends in the z direction but whose gradient extends in the x direction. A gradient field Gy which extends in the z direction and has a gradient in the y direction is generated by four coils 5 which may be identical to the coils 7 but which are arranged so as to be shifted 90° in space with respect thereto. Only two of the four coils 5 are shown in FIG. 1.

Because each of the three coil systems 3, 5 and 7 for generating the magnetic gradient fields Gz, Gy and Gx is symmetrically arranged with respect to the spherical surface 2, the field strength in the centre of the sphere, at the same time forming the origin of said cartesian x, y, z coordinate system is determined only by the steady, uniform magnetic field of the coil system 1. Furthermore, an rf coil 11 is symmetrically arranged with respect to the plane z=0 of the coordinate system, which rf coil is constructed so that it generates an rf magnetic field which is essentially uniform and which extends in the x direction, i.e. perpendicularly to the direction of the steady, uniform magnetic field. The rf coil receives an rf modulated current from an rf generator during each rf pulse. Subsequent to one or more rf pulses, the rf coil 11 serves for the reception of the echo signals generated in the examination zone by spin resonance. However alternatively use could be made of a separate rf receiver coil.

Figure 2:
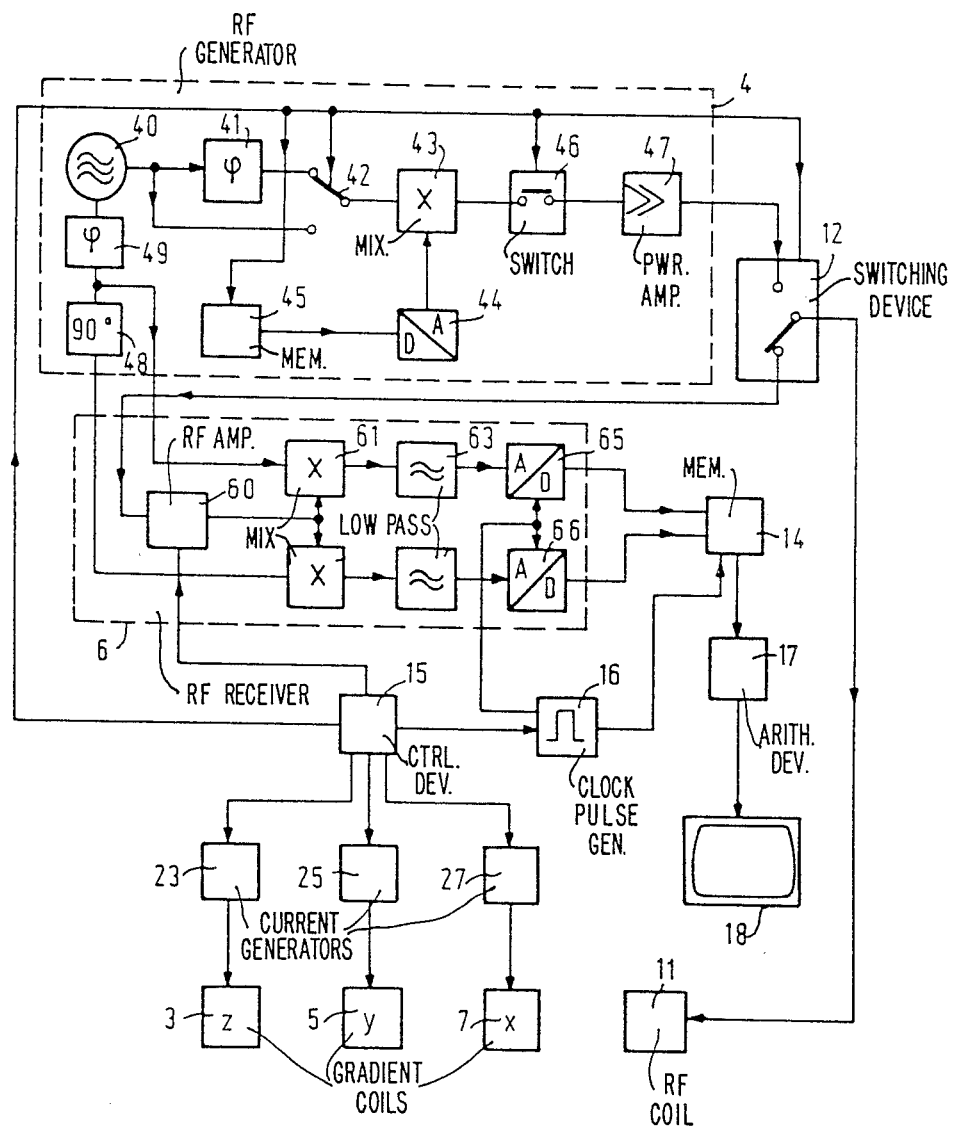
FIG. 2 shows a block diagram of such an apparatus.

FIG. 2 shows a simplified block diagram of this magnetic resonance tomography apparatus. Via a switching device 12, the rf coil 11 is connected to an rf generator 1 on the one side and to an rf receiver 6 on the other side.

The rf generator 4 comprises an rf oscillator 40 whose frequency can be digitally controlled and which generates oscillations of a frequency equal to the Larmor frequency of hydrogen protons. As is known, the Larmor frequency f is calculated in accordance with the relation f=cB, where B is the magnetic flux density in the steady, uniform magnetic field and c is the gyromagnetic ratio which, for example, amounts to 42.56 MHz/T for hydrogen protons. The output of the oscillator 40 is connected to an input of a mixing stage 43. The mixing stage 43 receives a second input signal from a digital to analog converter 44 whose input is connected to a digital memory 45. Under the control of a control device 15, a series of digital data words which constitute an envelope signal is read from the memory 45.

The mixing stage 43 processes the input signals applied thereto so that its output supplies the carrier oscillation modulated with the envelope signal. The output signal of the mixing stage 43 is applied, via a switch 46 which is controlled by the control device 15, to an rf power amplifier 47 whose output is connected to the switching device 12. This device is also controlled by the control device 15.

The receiver 6 comprises an rf amplifier 60 which is connected to the switching device and which receives the echo signals induced in the rf coil 11 and produced by spin resonance when the switching device 12 is controlled accordingly. The amplifier comprises a muting input which is controlled by the control device 15 and via which it can be blocked so that the gain is substantially zero. The output of the amplifier 60 is connected to the first inputs of two multiplying mixing stages 61 and 62, each of which Produces an output signal which corresponds to the product of its input signals. The second inputs of the mixing stages 61 and 62 receive a signal having the frequency of the oscillator 40, a phase shift amounting to 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied to a respective analog-to-digital converter 65, 66, respectively, via low-pass filters 63 and 64 which suppress the frequency supplied by the oscillator 40 as well as all higher frequencies and which conduct components having a lower frequency. The analog-to-digital converters convert the analog signals from the circuit 61 . . . 64, forming a quadrature demodulator, into digital data words which are applied to a memory 14.

The analog-to-digital converters 65 and 66 and the memory 14 receive their clock pulses from a clock pulse generator 16 which can be blocked and enabled, via a control lead, by the control device 15 so that the signals supplied by the rf coil 11 and transposed to the low frequency range can be converted into a series of digital data words for storage in the memory 14 only during a measuring interval which is defined by the control device 15.

Current generators 23, 25 and 27 supply the three coil systems 3, 5 and 7 with a respective current whose variation in time can be controlled by the control unit 15. The data words or sampling values stored in the memory 14 are applied to an arithmetic device 17 which determines the spatial distribution of the nuclear magnetisation in the slice examined therefrom and which outputs the distribution determined to a suitable reproduction unit, for example a monitor 18.

Figure 3:
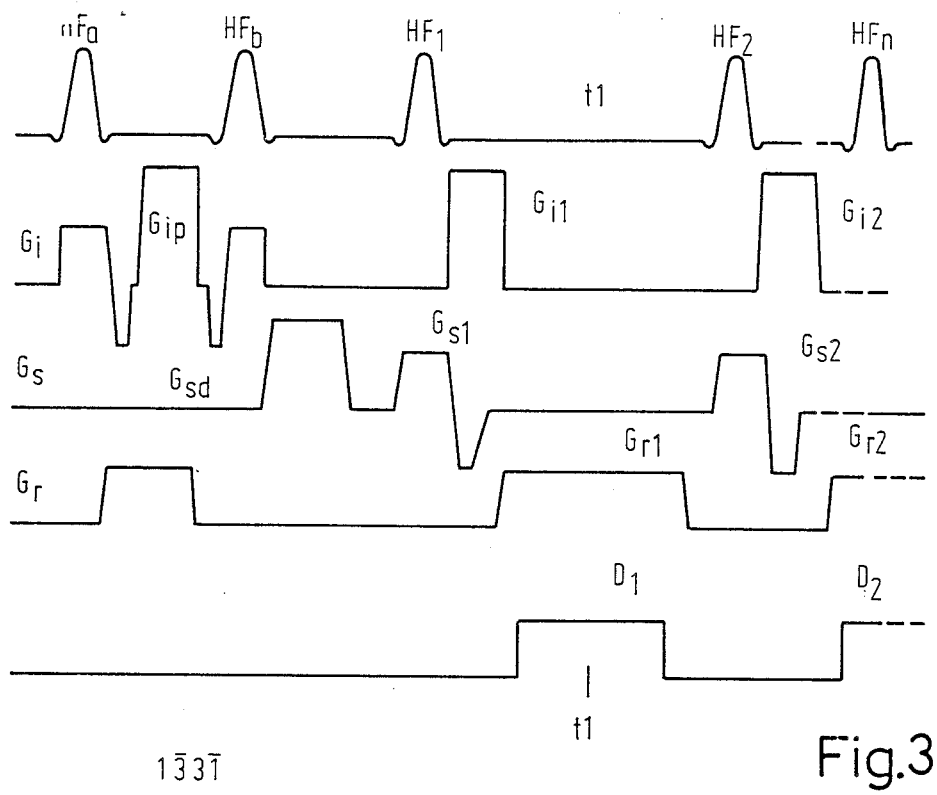
FIG. 3 shows the variation of time of various signals in a sequence in accordance with the invention.

FIG. 3 shows the variation in time of the signals generated by the rf coil 11 and the gradient coils 3, 5 and 7 and also the position of the measuring period during which the spin resonance signal is measured.

The first line of FIG. 3 shows the position in time of the rf pulses. The first rf pulse $HF_a$ is a slice selective rf pulse, i.e. a magnetic gradient field $G_i$ is activated during this rf pulse so that the nuclear magnetisation is influenced only in a slice whose position depends on the central frequency of the rf pulse $HF_a$ and whose thickness depends on the bandwidth thereof as well as on the strength of the magnetic gradient field. After the rf pulse the polarity of the magnetic gradient field is reversed in known manner, so that the time integral of the magnetic gradient field from the centre of the rf pulse until the instant of switching off of the gradient field has exactly the value zero.

Figure 4:
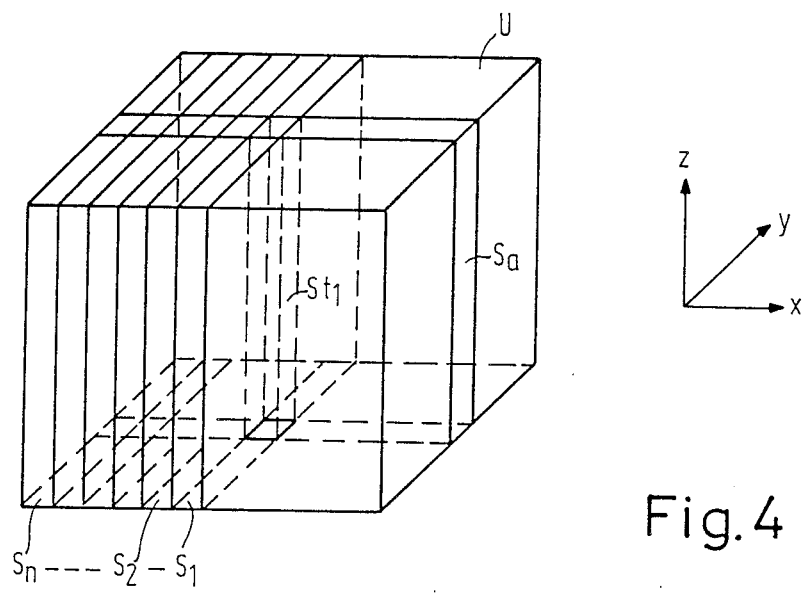
FIG. 4 shows an examination zone, assumed to have a square shape, and the position of the slices which are excited therein by the various rf pulses.

FIG. 4 shows the examination zone U which in this case has a square shape and also shows the position of the slice $S_a$ whose nuclear magnetisation is excited by the slice-selective rf pulse $HF_a$. The slice $S_a$ extends perpendicularly to the y direction when the gradient $G_i$ of the magnetic gradient field extends in the y direction. In this case the control unit 15 should activate the current generator 25 during the first rf pulse $HF_a$ (see FIG. 2) so that the gradient coil system 5 (FIG. 1) would generate a magnetic gradient field $G_y$ which is identical to the gradient field $G_i$. The gradient during the first rf pulse, however, may also extend in a different direction, for example in the x direction or the z direction or at an angle other than 90° with respect to said directions; in the latter case all three current generators should be simultaneously switched on during the first rf pulse.

After the first rf pulse and before the second rf pulse a magnetic gradient field is switched on and off. This gradient field may extend in the same direction as before as denoted by the curve $G_{ip}$ in FIG. 3. It could also extend in another direction. It ensures that the nuclear magnetisation in the slice $S_a$ is dephased.

Subsequently, a second slice selective rf pulse $HF_b$ is applied, which pulse influences the nuclear magnetisation in the same slice as the first rf pulse $HF_a$. It ensures that the nuclear magnetisation in the slice $S_a$ is partly rotated in the direction of the steady, uniform magnetic field, i.e. in the z direction.

After the second rf pulse and before the next rf pulse a magnetic gradient field is switched on and off. The gradient of this field may extend in the same direction as before, but also in a different direction. FIG. 3 shows the variation in time $G_{sd}$ of the magnetic gradient field $G_s$ which extends in the x direction, is generated by activation of the current generator 27 (FIG. 2) which is identical to the gradient $G_x$. The nuclear magnetisation previously rotated in the z direction cannot be influenced by this gradient field, but it can influence all other nuclear magnetisation so that spin echo signals or FID signals from the slice which are associated with the rf pulses $HF_a$ and $HF_b$ are suppressed.

Subsequently there is applied a series of further slice selective rf pulses $HF1$, $HF2$, ... $HF_n$, preferably at the same distance from one another. Because the central frequencies of these further rf pulses are different and because with each of these rf pulses there is associated a magnetic gradient field whose gradient $G_{s1}$, $G_{s2}$ ... see third line of FIG. 3) extend perpendicularly with respect to the gradient active during the two rf pulses, the nuclear magnetisation is excited in mutually parallel sub-slices $S_1$ ... $S_n$ which extend perpendicularly to the x direction and perpendicularly to the slice $S_a$. Each of these further rf pulses ensures that an FID signal is generated in the slice influenced thereby and that an STE signal is generated in the strip-shaped zone of intersection between the relevant sub-slice and the slice $S_a$ FIG. 4 shows only the strip-shaped zone of intersection or the strip $St_1$ in which the first (HF1) of these further rf pulses produces an STE signal. The other strips are situated parallel to the strip $St_1$ inside the slice $S_a$.

Before detection of the STE signal associated with each of the further rf pulses HF1 ... $HF_n$, a magnetic gradient field is switched on and off after each of these further rf pulses, as denoted by the curves $G_{i1}$, $G_{i2}$ on the second line of FIG. 3. The time integral over this magnetic gradient field between the instant of switching on and the instant of switching off is exactly equal to the time integral over the magnetic gradient field between the two rf pulses $HF_a$ and $HF_b$ (curve $G_{ip}$). As a result, for the relevant STE signal the dephasing effect of the magnetic gradient field ($G_{ip}$) between the two rf pulses $HF_a$ and $HF_b$ is exactly compensated for. However, the FID signal in the relevant sub-slice is fully dephased by the magnetic gradient field ($G_{i1}$). After the switching off of the magnetic gradient field, therefore, only an STE signal can be received from the associated strip (for example, $St_1$).

In order to enable reception of the STE signals from the individual strips, between the two rf pulses $HF_a$, $HF_b$ a magnetic gradient field $G_r$ having a gradient is switched on and off (fourth line) which gradient extends perpendicularly to the gradients $G_i$ and $G_s$ during the various rf pulses, i.e. in the longitudinal direction of the strip ($St_1$); thus, in the example shown in FIG. 4 it extends in the z direction. The STE signals arise when the so-called gradient condition is satisfied, i.e. when after each of the further pulses HF1, HF2 etc. the magnetic gradient field $G_r$ (curves $G_{r1}$, $G_{r2}$ etc.) is switched on and off so that the time integral over the period of time between the instant of switching on and the instant of occurrence of the STE signal (the instant $t_1$) is exactly equal to the time integral over the read gradient field between the rf pulses $HF_a$ and $HF_b$.

The STE signal generated in each of said strips defined by the slice $S_a$ and the sub-slice $S_1$ ... $S_n$ is measured in that the control device 15 enables the clock generator 16 also at the instant of occurrence of the STE signal (the variation in time of the enable signal D1, D2 is shown on the fifth line of FIG. 3), so that the STE signal received by the rf coil system is digitised by the analog-to-digital converter 65, 66 and stored in the memory 14, after which a one dimensional Fourier transform (each time over the sampling values of a single STE signal) is performed in the unit 17. This Fourier transform produce the nuclear magnetisation distribution in the direction of each time one strip.

As has already been stated, the distance between the last rf pulse $HF_n$ and the first rf pulse $HF_a$ should be smaller than the longitudinal relaxation time $T_1$; preferably, it should be small with respect to $T_1$. When the succession of rf pulses satisfies this condition for the longitudinal relaxation time of water-bound hydrogen protons, it is not possible to satisfy the condition for fat-bound hydrogen protons at the same time, because the longitudinal relaxation time for fat is substantially shorter than that for water. Consequently, the STE signals associated with the first one of the further rf pulses. (for example with HF1) contain signal components, whereas the STE signals originating from the last rf pulses (for example, $HF_n$) are determined exclusively by the hydrogen protons bound to water. This could lead to a misinterpretation of the tomograms thus formed.

Figure 5:
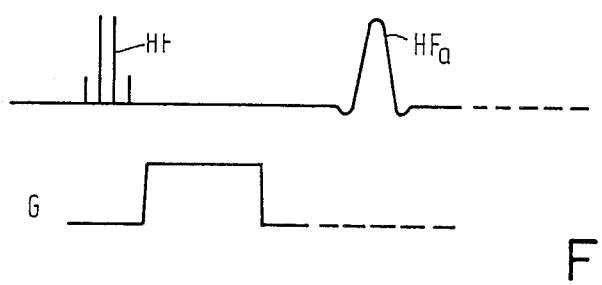
FIGS. 5 and 6 show the variations in time of signals occurring in various alternative versions of the method illustrated in FIG. 3.
Figure 6:
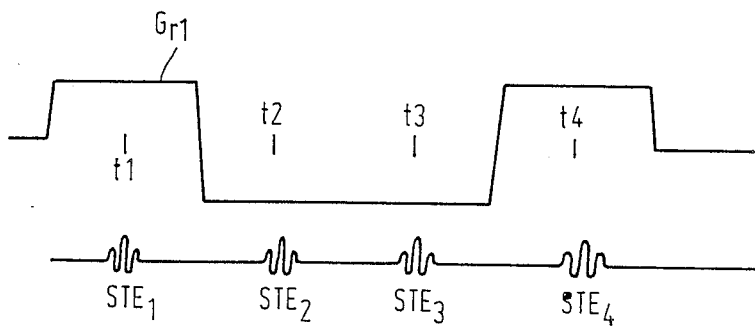

Such misinterpretation can be avoided when the signal components associated with fat tissue are eliminated from the very start. In accordance with FIG. 5, to this end the first rf pulse is preceded by a frequency selective 90° rf pulse $HF_0$ in the form of a binomial 1-$\bar{3}$-3-$\bar{1}$ rf pulse. Such a binomial rf pulse is known to consist of a series of sub-pulses whose associated flip angles relates in the same manner as the binomial coefficients, each sub-pulse rotating the nuclear magnetisation in the opposite direction with respect to the preceding sub-pulse. The central frequency of the sub-pulses corresponds exactly to the Larmor frequency of water which deviates by approximately 3.3 ppm from the Larmor frequency of fat. Consequently, the effect of these sub-pulses is cancelled for tissue containing water, i.e. such tissues are not excited by the binomial rf pulse. However, the distance in time between the sub-pulses is chosen so that together they act as a 90° rf pulse for fat. The binomial rf pulse thus represents a frequency selective rf pulse. The nuclear magnetisation excited thereby in the a tissue in the examination zone is dephased by a subsequent magnetic gradient field G (second line of FIG. 5). Consequently, the spin resonance signals generated by the subsequent rf pulses $HF_a$, $HF_b$, HF1 etc. do not contain signal components which originate from fat tissue and the image of the nuclear magnetisation distribution thus formed is a pure water image. If desired, other frequency selective pulses can also be used for saturating the fat signal.

The signal-to-noise ratio of an image of the nuclear magnetisation distribution formed by means of the method shown in FIG. 3 can be improved when, in addition to the first STE signal, multiply rephased STE signals are also used for imaging. To this end, the polarity of the magnetic gradient field (curve $G_{r1}$) for reading the first STE signal $STE_1$ is reversed when the time integral over this field (as from the associated rf pulse HF1) is twice as large as the corresponding integral in the interval between the rf pulses $HF_a$ and $HF_b$. At the instant t2, at which the time integral over the read gradient in the interval as from t1 (the occurrence of the first stimulated echo signal $STE_1$) reaches exactly the value zero, there is applied a further, rephased stimulated echo signal $STE_2$. A third STE signal $STE_3$) occurs at the instant t3 at which the time integral over this field (as from the rf pulse $HF_a$) reaches the value zero. A fourth signal occurs when subsequently the polarity of the gradient field is reversed again; reversal should take place when the time integral over the negative part of the read gradient $G_r$ is twice as large as the time integral over $G_{r1}$. In that case a fourth signal occurs at the instant t4 when the time integral over the gradient field from t3 to t4 has exactly the value zero. This process can be continued, if desired.

By summing the STE signals thus obtained (before or after the Fourier transformation), all signals originating from the strip $St_1$, this signal-to-noise ratio is improved. However, the period of time required for reading a strip is thus increased, so that not as many strips can be examined as in the method illustrated in FIG. 3.

in accordance with FIG. 3, the gradient of the magnetic gradient field extends in the same direction for the two first rf pulses $HF_a$ and $HF_b$, so that the same slice is excited thereby. However, it is alternatively possible to apply a magnetic gradient field having a gradient extending in the direction of the read gradient $G_r$ for the second rf pulse $HF_b$. The image section is thus simply defined.

Because of the longitudinal relaxation, the amplitude of the STE signals generated last (for example by $HF_n$) is lower than the amplitude of the signals generated first; as is known, the amplitude decreases in accordance with an exponential function where the longitudinal relaxation time T1 is the time constant. Therefore, in a tomogram the strips read last appear to be darker than the strips read first. This can be avoided when the flip angle (being the angle through which the nuclear magnetisation is rotated by the relevant rf pulse) of the further rf pulses increases in accordance with an exponential function, so that all STE signals have approximately the same amplitude and only the last rf pulse has a flip angle of 90°. In that case a uniform image is obtained in which, however, the signal-to-noise ratio of the strips read first is poorer than in an image in which all pulses HF1, . . . $HF_n$ are 90° rf pulses. The first two rf pulses $HF_a$ and $HF_b$ should in any case be 90° rf pulses.

The $T_1$ dependency of the STE signal can be used for measuring the relaxation time $T_1$. This can be realised in two ways.

(a) The method illustrated in FIG. 3 is performed at least twice, the sub-slices $S_1 \ldots S_n$ being excited for the second time in a sequence which differs from that used for the first excitation. Consequently, in each of the strips the nuclear magnetisation is measured with a different $T_1$ weight A $T_1$ calculation can thus be performed for the pixels within each strip.

(b) In the case of adequate signal intensity, a $T_1$ estimate can also be made by performing the method illustrated in FIG. 3 only once, provided that after the two rf pulses $HF_a$ and $HF_b$ the slices are not excited by each time a single rf pulse but by at least two rf pulses which are separated in time and at least the first of which may not be a 90° rf pulse, so that the nuclear magnetisation in the associated strip is not completely but only partly read by the first pulse. The signal information of the individual strips can thus be intermittently read, each time with a progressive $T_1$ weight, so that $T_1$ can be calculated.

I claim:

1. A magnetic resonance tomography method where a first slice selective rf pulse ($HF_a$) and a second rf pulse ($HF_b$) act on a slice ($S_a$) of an examination zone in the presence of a uniform, steady magnetic field, after which further slice selective pulses (HF1 ... HF$_n$) act on the examination zone in order to excite the nuclear magnetisation in mutual parallel sub-slices (S$_1$ ... S$_n$) which extend perpendicularly with respect to the slice (S$_a$), and where stimulated echo signals which occur in the associated sub-slice subsequent to each further rf pulse are received and subjected to a Fouzier transformation, characterized in that subsequent to each further rf pulse (HF1 ... HF$_n$) and before the reception of the associated Stimulated echo signal a magnetic gradient field (for example G$_{i1}$) is switched on and off in order to dephase the FID signal associated with the rf pulse, in that between the first and the second rf pulse (HF$_a$, HF$_b$) a magnetic gradient field (G$_{ip}$) is switched on and off, and in that the gradients of these fields extend parallel or anti-parallel with respect to one another, the absolute value of their time integral being the same.

2. A method as claimed in claim 1, characterized in that the second rf pulse (HF$_b$) is a slice-selective rf pulse.

3. A method as claimed in claim 2, characterized in that the second rf pulse (HF$_b$) influences the same slice (S$_a$) as the first rf pulse.

4. A method as claimed in claim 2, characterized in that the slice which is influenced by the second rf pulse (HF$_b$) extends perpendicularly with respect to the slice (S$_a$) influenced by the first rf pulse (HF$_b$) and perpendicularly with respect to the sub-slices (S$_1$ ... S$_n$).

5. A method as claimed in claim 1, where the echo signal is received in the presence of a magnetic gradient field, characterized in that after the reception of the stimulated echo signal (STE$_1$) the polarity of the gradient (G$_r$) is reversed, the rephased echo signals (STE$_2$ ... STE$_1$) subsequently occurring being received and evaluated.

6. A method as claimed in claim 1, characterized in that the first rf pulse (HF$_a$) is preceded by a frequency selective rf pulse (HF$_0$) which excites fat-bound hydrogen protons after which a magnetic gradient field (G) is switched on and off.

7. A method as claimed in claim 1, characterized in that the sub-slices are excited at least twice using a different distance in time between the first rf pulse and the rf pulse for the relevant sub-slice, the longitudinal relaxation time being determined from the different nuclear magnetisation along the strips defined by the sub-slices and the slice.

8. A method as claimed in claim 1, characterized in that the ratio of the magnetic gradient field applied in conjunction with each further rf pulse to the bandwidth of the relevant rf pulse is varied so that upon excitation of the sub-slices strips rf different width are excited.

9. A magnetic resonance tomography apparatus comprising: a magnet (1) for generating a steady, uniform magnetic field in an examination zone, a coil system (11) for generating rf magnetic fields in said zone, and gradient coils (3, 5, 7) for generating magnetic fields in said zone which extend in the direction of the uniform, steady magnetic field and which have a gradient which extends in the same direction or perpendicularly thereto, as well as a control unit (15) for controlling the rf coil (11) and the gradient coil system (3, 5, 7), characterized in that the control unit (15) controls the rf coil system (11) and the gradient coil system (3, 5, 7) so as to generate a first slice selective rf pulse (HF$_1$) and a second rf pulse (HF$_b$) acting on a slice ($_a$) in said examination zone, after which further slice selective pulses (HF$_1$ ... HF$_n$) act on the examination zone in order to excite the nuclear magnetization in mutual parallel sub-slices (S$_1$ ... S$_n$) which extend perpendicularly with respect to the slice (S$_a$) and so that between the first and the second rf pulse as well as after each further rf pulse a magnetic gradient field is switched on and of, the time integral over the period from the instant of switching on until the instant of switching off having the same value each time.

10. A method as claimed in claim 3, where the echo signal is received in the presence of a magnetic gradient field, characterized in that after the reception of the stimulated echo signal (STE$_1$) the polarity of the gradient (G$_r$) is reversed, the rephased echo signals (STE$_2$ ... STE$_4$) subsequently occurring being received and evaluated.

11. A method as claimed in claim 4, where the echo signal is received in the presence of a magnetic gradient field, characterized in that after the reception of the stimulated echo signal (STE$_1$) the polarity of the gradient (G$_r$) is reversed, the rephased echo signals (STE$_2$ ... STE$_4$) subsequently occurring being received and evaluated.

12. A method as claimed in claim 10, characterized in that the first rf pulse (HF$_a$) is preceded by a frequency selective rf pulse (HF$_0$) which excited fat-bound hydrogen protons, after which a magnetic gradient field (G) is switched on and off.

13. A method as claimed in claim 11, characterized in that the first rf pulse (HF$_a$) is preceded by a frequency selective rf pulse (HF$_0$) which excites fat-bound hydrogen protons, after which a magnetic gradient field (G) is switched on and off.

14. A method as claimed in claim 12, characterized in that the sub-slices are excited at least twice using a different distance in time between the first rf pulse and the rf pulse for the relevant sub-slice, the longitudinal relaxation time being determined from the different nuclear magnetization along the strips defined by the sub-slices and the slice.

15. A method as claimed in claim 13, characterized in that the sub-slices are excited at least twice using a different distance in time between the first rf pulse and the rf pulse for the relevant sub-slice, the longitudinal relaxation time being determined from the different nuclear magnetization along the strips defined by the sub-slices and the slice.

16. A method as claimed in claim 14, characterized in that the ratio of the magnetic gradient field applied in conjunction with each further rf pulse to the bandwidth of the relevant rf pulse is varied so that upon excitation of the sub-slices strips of different width are excited.

17. A method as claimed in claim 15, characterized in that the ratio of the magnetic gradient field applied in conjunction with each further rf pulse to the bandwidth of the relevant rf pulse is varied so that upon excitation of the sub-slices strips of different width are excited.

* * * * *